United States Patent
Meunier-Beillard et al.

(10) Patent No.: US 8,242,500 B2
(45) Date of Patent: Aug. 14, 2012

(54) METHOD OF MANUFACTURING HETEROJUNCTION BIPOLAR TRANSISTOR AND HETEROJUNCTION BIPOLAR TRANSISTOR

(75) Inventors: Philippe Meunier-Beillard, Kortenberg (BE); Johannes Josephus Theodorus Marinus Donkers, Valkenswaard (NL); Hans Mertens, Leuven (BE); Tony Vanhoucke, Bierbeek (BE)

(73) Assignee: NXP B.V., Eindhoven (NL)

( * ) Notice: Subject to any disclaimer, the term of this patent is extended or adjusted under 35 U.S.C. 154(b) by 46 days.

(21) Appl. No.: 13/005,435

(22) Filed: Jan. 12, 2011

(65) Prior Publication Data
US 2011/0198591 A1    Aug. 18, 2011

(30) Foreign Application Priority Data
Jan. 13, 2010  (EP) .................................... 10150681

(51) Int. Cl.
*H01L 29/04* (2006.01)
(52) U.S. Cl. ... 257/51; 257/197; 257/198; 257/E21.371; 257/E29.003
(58) Field of Classification Search .................. 257/51, 257/197, 198, E21.371, E29.003
See application file for complete search history.

(56) References Cited

FOREIGN PATENT DOCUMENTS
EP     1 406 308 A2     4/2004
WO     03/100845 A1     12/2003
WO     2009/141753 A1   11/2008

OTHER PUBLICATIONS

Yamamoto, Y. et al., "Chemical vapor phase etching of polycrystalline selective to epitaxial Si and SiGe", Thin Solid Films 508, Elsevier, (2006) pp. 297-300.
European Search Report for European Patent Appln. No. 10150681.4 (Jun. 10, 2010).

*Primary Examiner* — Long Pham

(57) ABSTRACT

Disclosed is a method of forming a heterojunction bipolar transistor (HBT), comprising depositing a first stack comprising an polysilicon layer (16) and a sacrificial layer (18) on a mono-crystalline silicon substrate surface (10); patterning the first stack to form a trench (22) extending to the substrate; depositing a silicon layer (24) over the resultant structure; depositing a silicon-germanium-carbon layer (26) over the resultant structure; selectively removing the silicon-germanium-carbon layer (26) from the sidewalls of the trench (22); depositing a boron-doped silicon-germanium-carbon layer (28) over the resultant structure; depositing a further silicon-germanium-carbon layer (30) over the resultant structure; depositing a boron-doped further silicon layer (32) over the resultant structure; forming dielectric spacers (34) on the sidewalls of the trench (22); filling the trench (22) with an emitter material (36); exposing polysilicon regions (16) outside the side walls of the trench by selectively removing the sacrificial layer (18) of the first stack; implanting boron impurities into the exposed polysilicon regions (16) to define base implants; and exposing the resultant structure to a thermal budget for annealing the boron impurities. A HBT formed by this method is also disclosed.

5 Claims, 7 Drawing Sheets

METHOD OF MANUFACTURING HETEROJUNCTION BIPOLAR TRANSISTOR AND HETEROJUNCTION BIPOLAR TRANSISTOR

CROSS-REFERENCE TO RELATED APPLICATIONS

This application claims the priority under 35 U.S.C. §119 of European patent application no. 10150681.4, filed on Jan. 13, 2010, the contents of which are incorporated by reference herein.

FIELD OF THE INVENTION

The present invention relates to a method of manufacturing a heterojunction bipolar transistor (HBT).

The present invention further relates to a HBT manufactured in accordance with this method.

BACKGROUND OF THE INVENTION

HBTs are attracting considerable attention as such transistors are capable of being used in high frequency applications such as RF applications, and being integrated in CMOS processes without requiring many additional processing steps.

An example of such a HBT is for instance disclosed in EP 1 406 308 A2. As has been disclosed in this patent application, Si—Ge—C alloys may be advantageously used as a base material in such transistors as the addition of carbon to the well-known Si—Ge alloys improves the controllability of the diffusion of boron impurities in the intrinsic base, thus improving the controllability of the performance characteristics of the HBT, which facilitates the use of the transistor in e.g. RF applications. However, a drawback of the HBT disclosed in EP 1 406 308 A2 is that its manufacture is rather complex, which adds to the cost of the integrated circuit (IC) into which the HBT is to be integrated.

Figure 1:
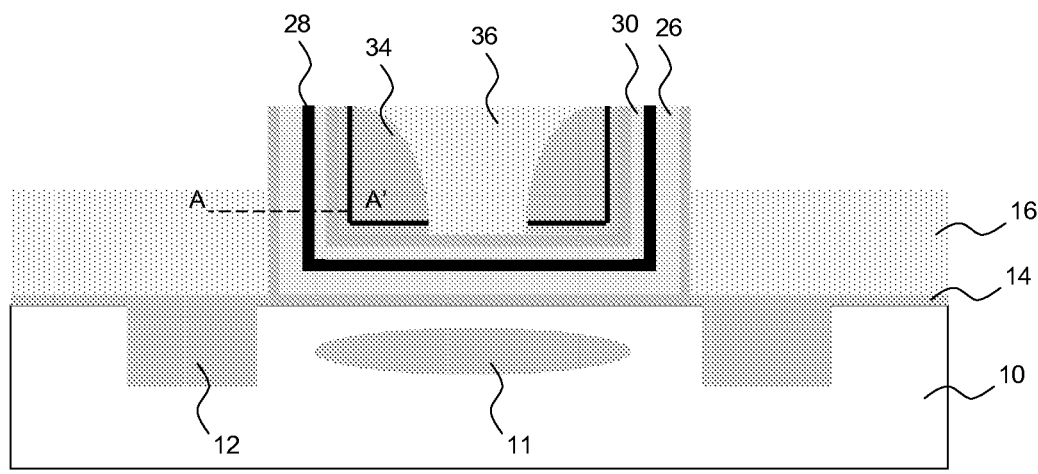

FIG. 1 shows another known HBT having a reduced manufacturing complexity. The HBT is formed on a mono-crystalline silicon substrate 10 having shallow trench isolation regions 12 in between which a collector impurity 11 is implanted into the substrate 10. The base has been formed by depositing a stack of a first intrinsic Si—Ge—C layer 26, a boron-doped Si—Ge—C layer 28 and a further intrinsic Si—Ge—C 30 layer into a trench formed in a stack comprising a poly-Si layer 16 and a nitride layer (not shown). The poly-Si layer 16 is sometimes referred to as a poly-Si gate because it may be deposited using the same CMOS processing steps to deposit a poly-Si gate for a FET. It should however be understood that the poly-Si layer 16 acts as a contact rather than a control terminal in a HBT, as will be explained in more detail below. Obviously, a bias voltage may be applied to the extrinsic base contact 16.

The carbon-doped layers 26 and 30 surrounding the boron-doped Si—Ge—C layer 28 act as boron diffusion buffer layers during activation of the base such that the boron impurity remains largely confined to the Si—Ge—C layers, thus resulting in a highly doped base, which ensures that the base can cope with high switching speeds. The carbon content in these layers ensures that boron migration is retarded to such an extent that by the appropriate choice of layer dimensions and carbon impurity levels, the boron can be effectively confined to the Si—Ge containing layers following annealing.

An emitter 36 is stacked onto the intrinsic base layer 28. In such a HBT, the emitter 36 is usually contacted from above and the collector 11 is usually contacted through the substrate 10, i.e. from below. The base 28 is typically contacted through lateral contacts, which are commonly referred to as extrinsic base regions. The extrinsic base regions are formed in the poly-Si layer 16 over an oxide 14, and are separated from the emitter 36 by sidewall spacers 34.

In order to obtain a good contact between the extrinsic base regions 16 and the intrinsic base 28, the extrinsic base regions 16 are usually implanted with a boron impurity, which is subsequently (laterally) diffused by an anneal step to connect the extrinsic and intrinsic base regions.

However, a drawback of this device is that the vertical portions of the intrinsic Si—Ge—C buffer layer 26 that separate the boron-doped Si—Ge—C intrinsic base layer 28 from the extrinsic base regions prohibit the diffusion of boron between the extrinsic base and the intrinsic base region during annealing, such that the resulting device suffers from a higher than desirable base resistance.

Figure 2:
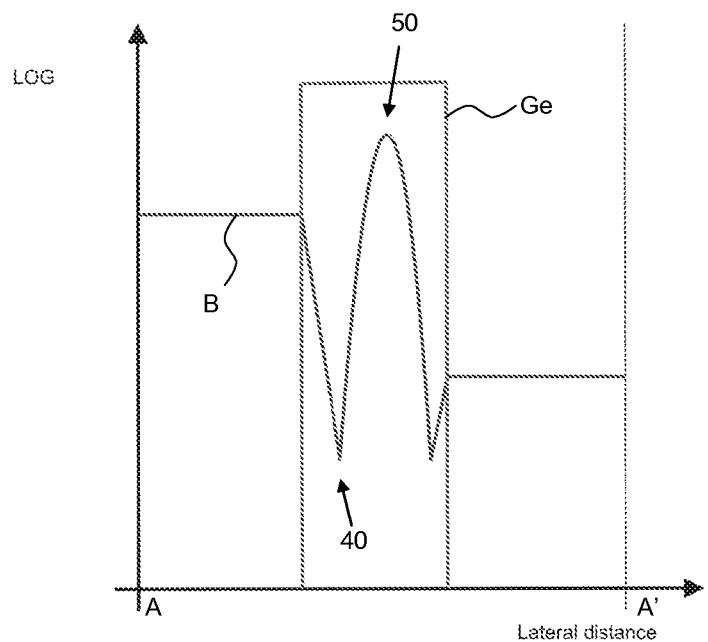

This is shown in FIG. 2, in which the boron lateral concentration due to the presence of a negative spike in the boron concentration profile along the line A-A', i.e. at the first intrinsic Si—Ge—C layer. The negative spike 40 occurs in the intrinsic Si—Ge—C layer 26, which as previously explained prohibits the lateral migration of the boron implant in the extrinsic base region 16 towards the Si—Ge—C layer 28. The Ge-containing region of the HBT of FIG. 1 has been labeled Ge in FIG. 2. The positive spike 50 corresponds to the boron concentration in the Si—Ge—C layer 28. The relatively high base resistance caused by the negative spike 50 limits the performance of the HBT in high frequency applications such as RF devices.

SUMMARY OF THE INVENTION

The present invention seeks to provide a method of manufacturing a HBT that combines a low complexity with improved base resistance characteristics.

The present invention further seeks to provide a HBT having improved base resistance characteristics compared to the device shown in FIG. 1.

In accordance with a first aspect of the present invention, there is provided a method of forming a heterojunction bipolar transistor, comprising depositing a first stack comprising an polysilicon layer and a dielectric layer over the oxide layer on a single crystal silicon substrate; patterning the first stack to form a trench extending to the substrate; depositing a silicon layer over the resultant structure; depositing a silicon-germanium-carbon layer over the resultant structure; selectively removing the silicon-germanium-carbon layer from the sidewalls of the trench; depositing a boron-doped silicon-germanium-carbon layer over the resultant structure; depositing a further silicon layer over the resultant structure; forming dielectric spacers on the sidewalls of the trench; filling the trench with an emitter material; exposing polysilicon regions outside the side walls of the trench by selectively removing the dielectric layer of the first stack; implanting boron impurities into the exposed polysilicon regions to define base implants; and exposing the resultant structure to a thermal budget for annealing the boron impurities.

Due to the selective removal of the intrinsic Si—Ge—C layer from the side walls of the trench in which the extrinsic base and emitter are formed, the boron impurities in the extrinsic base can migrate into the boron-doped Si—Ge—C layer, thus avoiding the presence of the negative boron concentration spike in the boron concentration profile from the extrinsic base into the intrinsic base region. Consequently, a HBT having an improved, i.e. lower, base resistance is achieved, which makes the HBT more suitable for high-frequency, e.g. RF applications.

The aforementioned selective removal is possible because the portion of Si—Ge—C layer that grows on the monocrystalline substrate, i.e. the horizontal portion in the bottom of the trench has a mono-crystalline texture, whereas the portion of Si—Ge—C layer formed on the sidewalls of the trench has a polycrystalline texture due to its growth onto a poly-crystalline silicon layer and an amorphous dielectric layer, which implies that the susceptibility of the respective portions of the Si—Ge—C layer is different to removal, e.g. by etching. In other words, the higher susceptibility of the polycrystalline Si—Ge—C portion to e.g. etching allows for the selective removal of this material from at least the side walls of the trench, thus removing the lateral boron-diffusion barrier between the boron-doped Si—Ge—C layer forming the intrinsic base and the poly-Si regions forming the extrinsic base, such that an improved connection between the intrinsic and extrinsic base can be established.

In a preferred embodiment, the step of selectively removing the silicon-germanium-carbon layer from the sidewalls is performed by means of HCl vapor etching. This etching recipe is known to have high selectivity for removal of SiGe from polycrystalline silicon, as for instance has been disclosed by Yamamoto et al. in Thin Solid Films, 508 (2006), pages 297-300. The present application has been based on the realization that a similar selectivity is observed from Si—Ge—C materials deposited on epitaxial (mono-crystalline) silicon and poly-crystalline silicon respectively. In other words, such etch recipes allow for a discrimination between a Si—Ge—C material deposited on a surface having a regular structure such as an epitaxial Si surface and an surface having a more random (amorphous) structure, such as a poly-Si surface, as previously explained.

The trench may be formed in any suitable manner, such as by etching. In this case, the method may further comprise depositing an etch stop layer over the substrate prior to the deposition of the first stack, and wherein the patterning the first stack to form a trench extending to the substrate comprises etching said trench until the etch stop layer is exposed; and subsequently removing the etch stop layer from the trench prior to depositing the silicon layer. This protects the substrate from being damaged in the trench etching step.

The dielectric spacers between the vertical portion of the extrinsic base region and the emitter region of the HBT may be formed in any suitable manner. In an embodiment, the step of forming dielectric spacers on the sidewalls of the trench comprises depositing an oxide-nitride-oxide stack over the resultant structure obtained after depositing the further silicon layer; exposing the oxide-nitride-oxide stack to an anisotropic oxide etch; and removing the nitride and oxide layers of the oxide-nitride-oxide stack from the top of the resultant structure prior to filling the trench with the emitter material.

The step of filling the trench with the emitter material may comprise depositing the emitter material over the resultant structure obtained after forming the dielectric spacers and planarizing the deposited emitter material until the nitride layer of the first stack is reached.

In accordance with another aspect of the present invention, there is provided a heterojunction bipolar transistor comprising a silicon substrate having a mono-crystalline surface carrying boron-doped polysilicon regions defining extrinsic base regions separated by a filled trench over a collector region in the substrate, said filled trench comprising an emitter portion separated from the substrate by a layer stack including a boron-doped silicon-germanium-carbon base layer in between a first silicon-germanium-carbon layer facing the silicon substrate and a second silicon-germanium-carbon layer facing the emitter portion, said emitter portion being laterally separated from the extrinsic base regions by respective side wall spacers, wherein the first silicon-germanium-carbon layer in said filled trench extends across the bottom of the filled trench only.

Consequently, because the first silicon-germanium-carbon buffer layer does not extend over the sidewalls of the filled trench, the intrinsic base formed by the boron-doped silicon-germanium-carbon base layer and the extrinsic poly-Si base regions are not separated by the first silicon-germanium-carbon buffer layer retarding the migration of boron from the poly-Si regions towards the intrinsic base during an anneal step.

If any layer is present between the intrinsic and extrinsic base regions, such a layer must be thin enough and of a material that facilitates boron migration between the poly-Si regions and the intrinsic base layer, such that following annealing, the boron doping profile from the intrinsic base region into the extrinsic base regions is continuously decreasing in the HBT of the present invention, i.e. does not exhibit a negative spike. This has the advantage that the HBT has improved performance characteristics in high-frequency applications due to the absence of the negative spike 40 in the lateral boron doping profile.

The HBT of the present invention may be advantageously incorporated into an IC, such as an analog signal processing IC for mobile communication devices, e.g. mobile phones. Such an IC itself may be advantageously incorporated into an electronic device such as a mobile communications device, a personal digital assistant, a consumer electronics device and so on.

BRIEF DESCRIPTION OF THE EMBODIMENTS

Figure 3A:
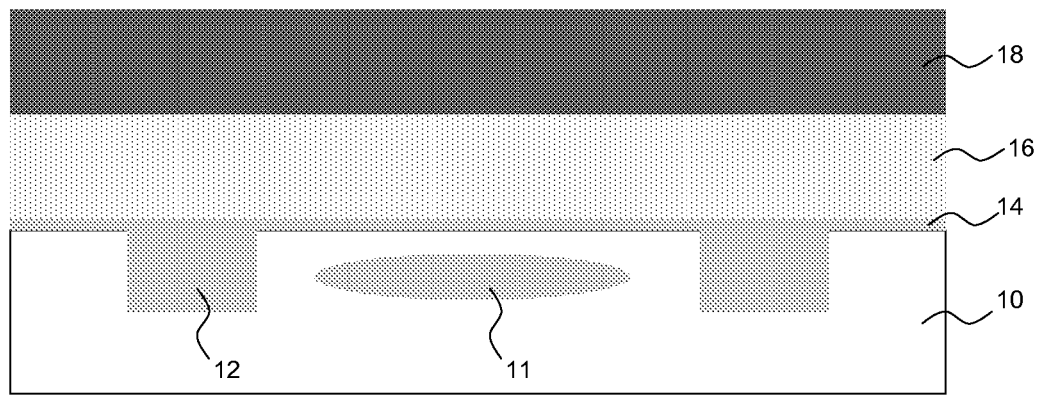
Figure 3B:
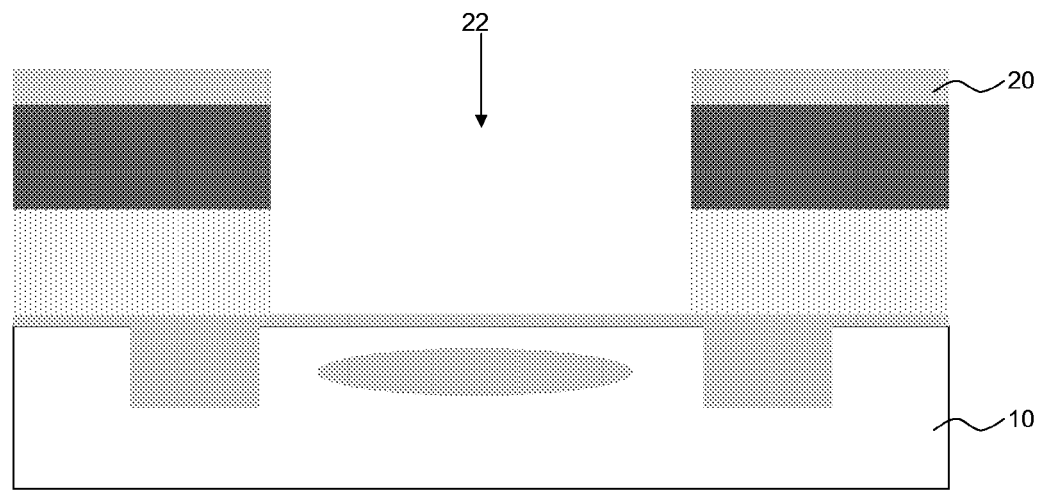
Figure 3C:
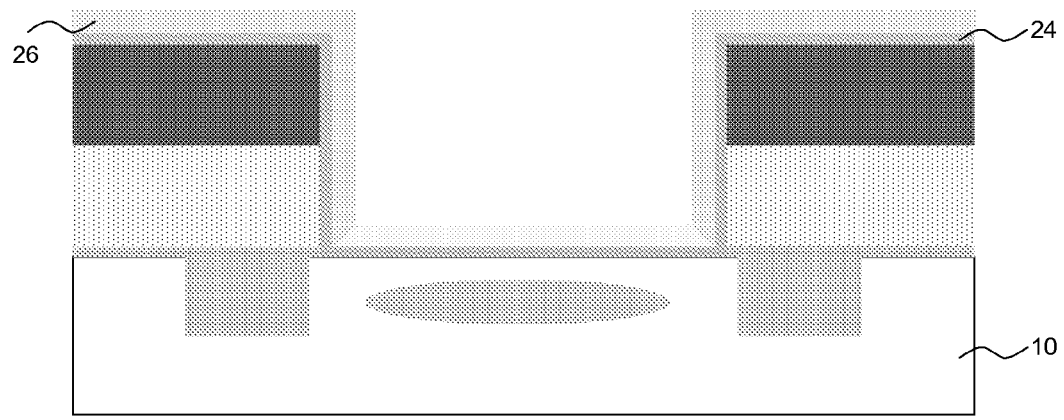
Figure 3D:
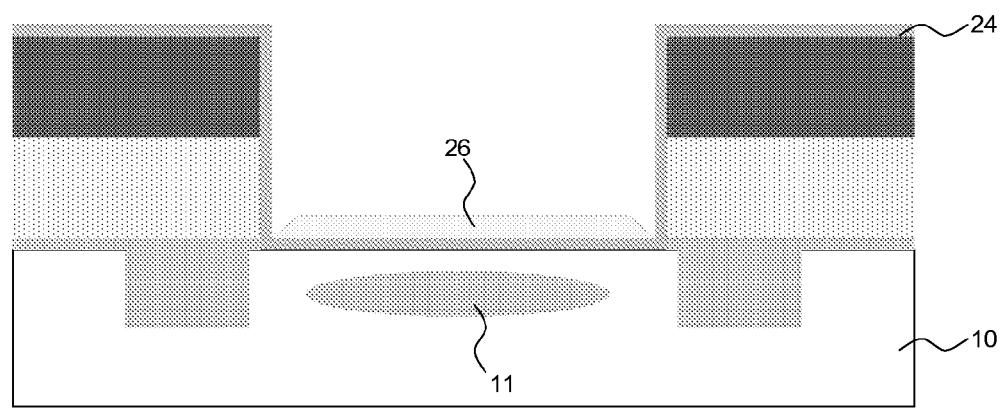
Figure 3E:
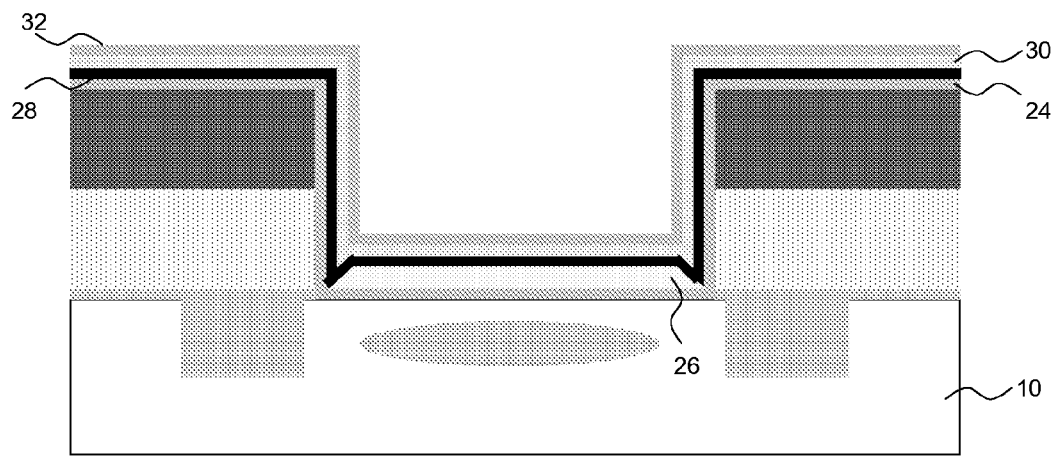
Figure 3F:
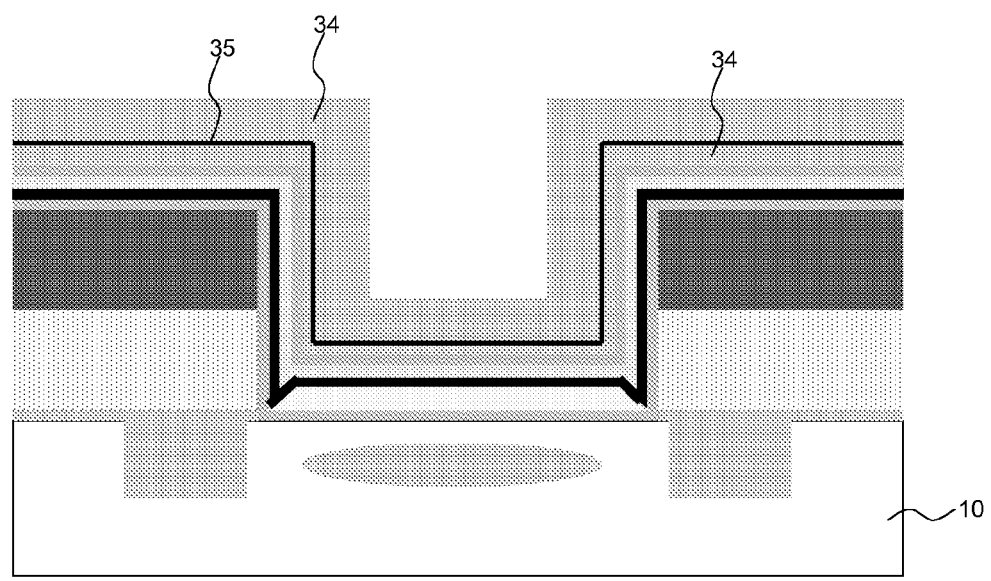
Figure 3G:
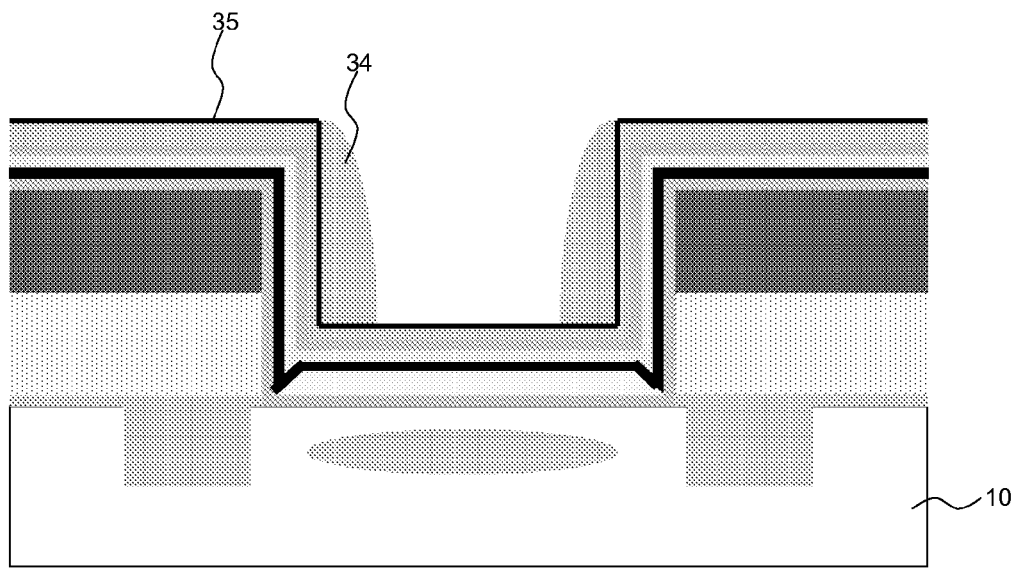
Figure 3H:
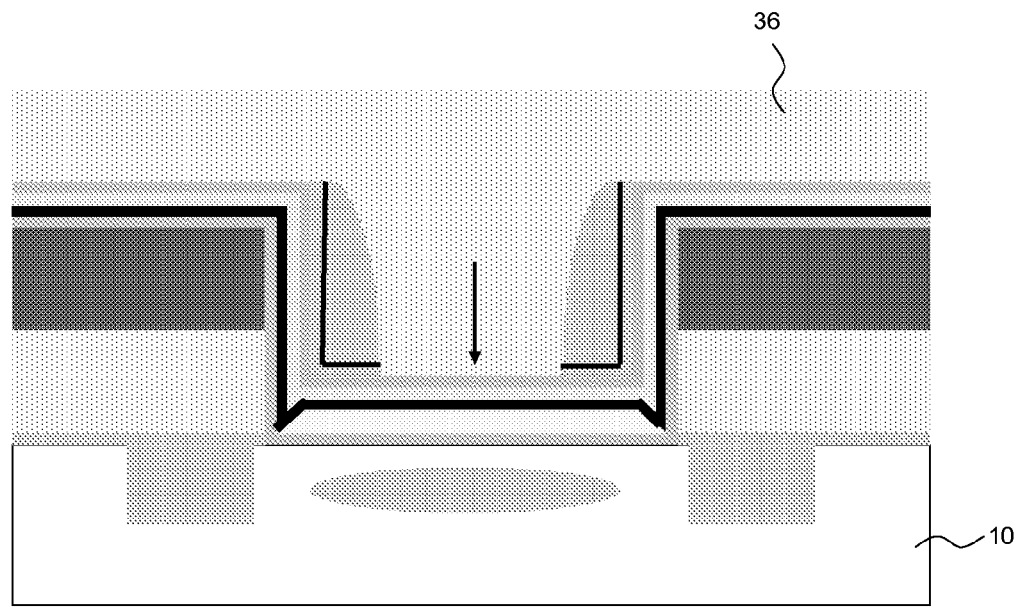
Figure 3I:
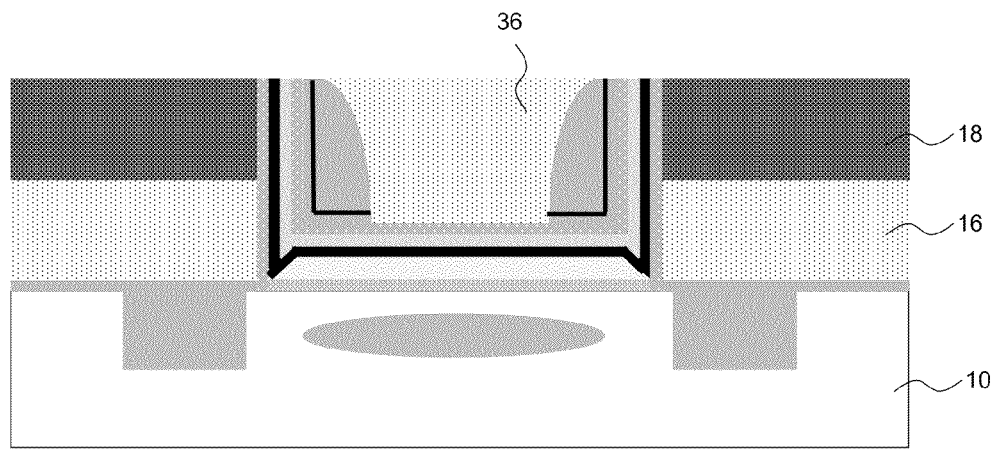
Figure 3J:
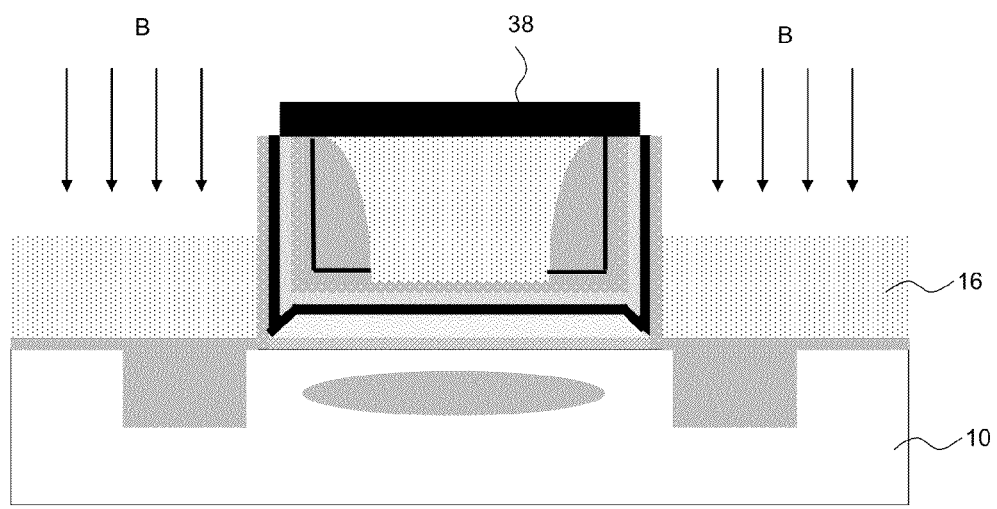
Figure 3K:
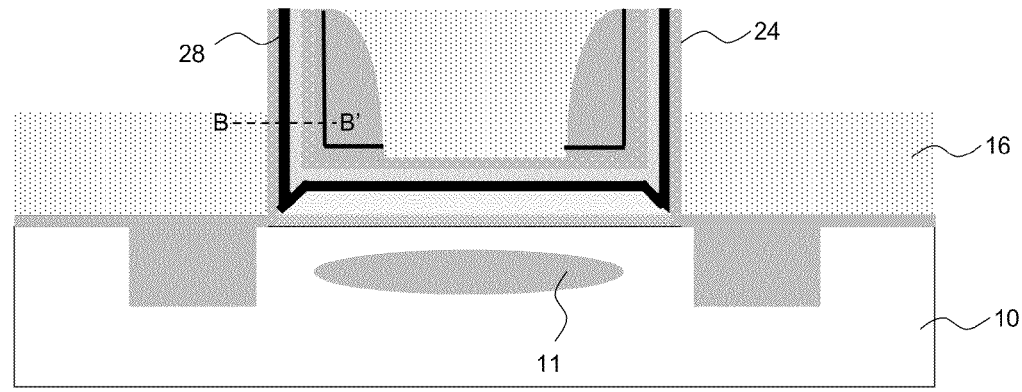
Figure 4:
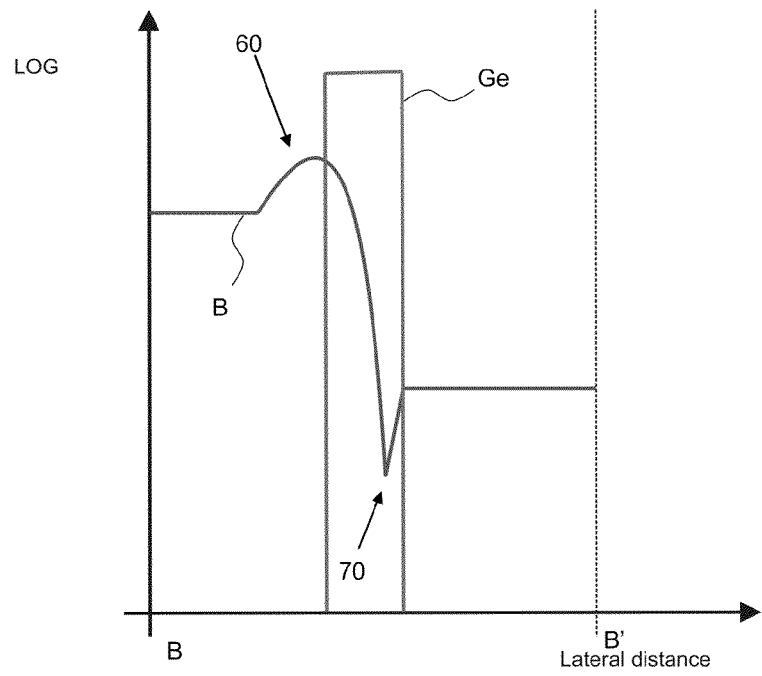

Embodiments of the invention are described in more detail and by way of non-limiting examples with reference to the accompanying drawings, wherein FIG. 1 schematically depicts a prior art HBT;

FIG. 2 schematically depicts a doping profile of the HBT of FIG. 1;

FIG. 3a-k schematically depict a method of manufacturing a HBT in accordance with an embodiment of the present invention; and FIG. 4 schematically depicts a doping profile of a HBT manufactured in accordance with an embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 3a-k give a non-limiting example of a manufacturing method of a HBT in accordance with an embodiment of the present invention. It is pointed out that the use of several materials is by way of non-limiting example only, and that other materials suitable for the same purpose may be used instead. Similarly, the skilled person will be aware of alternatives for the processing steps depicted in these figures. For the sake of brevity, such alternative materials and processing steps will not be explicitly described, but it will be merely pointed out that such alternatives exist.

In FIG. 3a, a substrate 10 is provided with comprises STI regions 12 and a collector implant 11. The STI regions 12 may be formed in any suitable manner, e.g. by forming a trench and filling the trench with a suitable oxide, e.g. $SiO_2$. The STI regions 12 may also be replaced by other suitable solutions for isolating the HBT in the substrate 10. It is important that the upper surface of the substrate 10 comprises mono-crystalline silicon, the reason for which will be explained in more detail later. Hence, the substrate 10 may be a mono-crystalline silicon substrate or may comprise an upper layer of epitaxial silicon (not shown). For the sake of completeness, it is pointed out that mono-crystalline silicon, which is sometimes also referred to as a single crystal, comprises a crystal lattice having a single orientation, as opposed to poly-crystalline silicon, which lattice has multiple orientations, i.e. is more amorphous.

A dielectric layer 14 acting as an etch stop layer may be formed over the substrate 10. A suitable candidate material for the etch stop layer 14 is a gate oxide layer although other materials may also be considered. A polysilicon layer 16 is subsequently grown, and covered by a sacrificial layer 18. The polysilicon layer is sometimes also referred to as the poly-Si gate. The sacrificial layer 18 is used at a later stage as a stop layer. For this reason, the sacrificial layer 18 may be a dielectric layer such as a nitride layer. The polysilicon layer 16 and the sacrificial layer 18 will also be referred to as a first stack of layers.

In FIG. 3b, a mask layer 20 is formed over the first stack, e.g. by spinning a resist onto the first stack, and subsequently patterned, after which a trench 22 is etched in the first stack over the collector implant 11. This etching step, for which any suitable etchant may be used, is designed to stop at the etch stop layer 12 to protect the mono-crystalline substrate surface from being damaged in the etching process.

Next, as shown in FIG. 3c, the etch stop layer 14 is removed from the trench after which an intrinsic silicon layer 24 and an intrinsic Si—Ge—C (silicon-germanium-carbon) layer 26 are grown over the resultant structure. The intrinsic silicon layer 24 acts as a seed layer for the intrinsic Si—Ge—C layer 26, which cannot effectively grow on certain materials including $SiO_2$. Hence, the presence of the intrinsic Si layer 24 ensures that the intrinsic Si—Ge—C layer 26 exhibits the appropriate growth characteristics in areas extending e.g. over STI regions 12. In the context of the present application, the term 'intrinsic' is used to indicate that no impurities have been added to such materials. A suitable deposition technique for these layers is chemical vapor deposition (CVD). Alternative deposition schemes are also feasible as long as the bottom and side walls of the trench 22 are covered by these layers.

Due to the epitaxial nature of the exposed surface of the silicon substrate 10, the intrinsic silicon layer 24 will have a mono-crystalline structure at the bottom of the trench 22, whereas the intrinsic silicon layer 24 on the side walls of the trench 22 will have a more amorphous structure. Consequently, the intrinsic Si—Ge—C layer 26, which is used as a buffer layer as will be explained in more detail below, will also have a largely mono-crystalline structure at the bottom of the trench 22, whereas this layer will also have a more amorphous structure on the side walls of the trench 22, as induced by the underlying intrinsic silicon layer 24. The exact composition of the Si—Ge—C layer 26 is not essential to the present invention. As a non-limiting example, a Si—Ge—C layer 26 roughly having an 80 atom % Si content and a 20 atom % Ge content, with a C-content of less than 1 atom %, e.g. 0.2 atom % may be used. Preferably, the intrinsic Si—Ge—C layer 26 is thicker than the intrinsic silicon layer 24, e.g. twice as thick.

The aforementioned difference in crystal structure is utilized in a next step to selectively remove the more amorphous Si—Ge—C layer 26 from at least the side walls of the trench 22, as shown in FIG. 3d. The amorphous intrinsic Si—Ge—C layer 26 may also be removed from the top of the sacrificial layer 18. A suitable way of selectively removing such predominantly amorphous Si—Ge is by means of a vapor HCl etch, as disclosed by Yamamoto et al. It has been found that the additional carbon content in such a material does not significantly alter the selectivity of such an etching process. The HCl etching step may be optimized by varying the process conditions, e.g. temperature and partial HCl pressure.

Upon removal of the intrinsic Si—Ge—C layer 26 from the side walls of the trench 22, a boron-doped Si—Ge—C layer 28, an intrinsic Si—Ge—C layer 30 and a boron-doped silicon layer 32 for limiting the resistance of the intrinsic base are sequentially deposited over the resultant structure, e.g. by means of CVD. This is shown in FIG. 3e. The Si, Ge and C content of the boron-doped Si—Ge—C layer 28 and the further intrinsic Si—Ge—C layer 30 may be the same as the intrinsic Si—Ge—C layer 26 or may all be different. Preferably, the boron concentration in the boron-doped Si—Ge—C layer 28 is in the range of $1.10^{19}$-$2.10^{20}$ atoms/cm$^3$, and the boron concentration in the boron-doped Si layer 32 is in the range of $5.10^{17}$-$5.10^{18}$ atoms/cm$^3$.

At this point, it is noted that the resultant structure comprises a boron-doped Si—Ge—C layer 28 that is separated from the poly-Si layer 16 by a thin layer of intrinsic silicon only. Consequently, upon exposure of the HBT to a thermal budget for annealing purposes, there is no boron migration barrier between the vertical portion of the boron-doped Si—Ge—C layer 28, i.e. the sidewall portion of this layer and the poly-Si layer 16, such that a more continuous boron diffusion profile, i.e. lacking the negative spike 40, can be established between the intrinsic base including the vertical portion of the boron-doped Si—Ge—C layer 28 and the extrinsic base defined by the poly-Si regions 16. This will be demonstrated in more detail below.

The next steps of the exemplary method are directed to forming the emitter of the HBT. As shown in FIG. 3f, a dielectric material for forming spacers between the base materials in the trench 22 and the emitter to be formed is deposited over the resultant structure. The dielectric material may for instance comprise a so-called ONO stack, i.e. a pair of oxide layers 34 separated by a nitride layer 35. Typically, the first deposited oxide layer 34 and the nitride layer 35 are much thinner than the second deposited oxide layer. For instance, in a 140 nm technology, the first oxide layer 34 may be around 5 nm thick, the nitride layer 35 may be around 10 nm thick and the second oxide layer 34 may be around 100 nm thick by way of non-limiting example. Obviously, the thicknesses as well as the ratio of thicknesses may be varied in accordance with device specifications and technology scale used. The dielectric spacer material may be deposited or grown in any suitable manner.

In a next step, shown in FIG. 3g, spacers 34 are formed by exposing the ONO stack to an anisotropic etch, e.g. using C4F8/Ar based chemistry, and using the nitride layer 35 as an etch stop layer. Many other suitable etch recipes are known per se and are therefore not discussed further for the sake of brevity. The nitride layer 35 and underlying oxide layer 34 are subsequently removed, for instance by using a wet nitride etch with $H_3PO_4$ by way of non-limiting example, which exposes the boron-doped silicon layer 32 at the bottom of the trench 22, as indicated by the arrow in FIG. 3h. This etching step is typically performed for a duration such that the vertical spacer structures 34 are only thinned but not fully removed.

Following this nitride and oxide removal, an emitter material 36 is deposited over the resultant structure, e.g. a poly-crystalline silicon emitter material 36.

The resultant structure is subsequently planarized using sacrificial layer 18, e.g. a nitride layer, as a stop layer. This is shown in FIG. 3i. A suitable planarization technique is chemical mechanical polishing (CMP) although other planarization techniques may also be contemplated. Following planarization, the sacrificial (nitride) layer 18 is removed, e.g. by means of an etching step, after which a cap layer 38 is formed over the stacked base/emitter structure, as shown in FIG. 3j. This may be achieved in any suitable way, for instance by forming a photoresist layer over the stacked base/emitter structure by deposition and subsequent patterning. Since the formation of such caps is well-known per se, this is not further explained for reasons of brevity only.

The cap layer 38 is used to protect the emitter 36 from the implanting of boron impurities in the now exposed polycrystalline silicon layer 16 to define the extended base regions of the HBT. The boron implants may be realized using standard CMOS source/drain implants. For instance, in a 140 nm CMOS process, the boron source drain implants may be performed at 4-13 keV to give a projected implantation depth of 16-48 nm with boron concentrations preferably ranging from $1.10^{15}$-$1.10^{16}$ atoms/cm$^3$.

Following the extrinsic base implanting, the cap layer 38 is removed, e.g. by means of stripping in case of the cap layer 38 being a polymer-based resist material, and the implants are activated, i.e. annealed, by exposing the resultant structure to a suitable thermal budget, thus yielding the HBT shown in FIG. 3k. At this stage, it is pointed out that the Si—Ge—C layers 26 and 30 pact as boron diffusion retardation layers during this anneal step such that boron diffusion from the boron-doped Si—Ge—C base layer 28 is largely confined within the Si—Ge—based layers 26, 28, 30 due to the presence of the carbon in these layers as previously explained, thus resulting in a highly doped base for the HBT of the present invention.

Further processing steps, e.g. back-end processing steps for the formation of contacts to e.g. the base and emitter regions, have been omitted as the choice of implementation of such back-end processing steps has no bearing on the present invention.

FIG. 4 shows the lateral boron concentration profile along the line B-B' of the HBT of FIG. 3k. The germanium-containing regions of the HBT of the present invention are limited to the boron-doped Si—Ge—C layer 28 facing the extended base region 16 and the intrinsic Si—Ge—C layer 30 separating the boron-doped Si—Ge—C layer 28 from the emitter 36 over the collector area 11. The effect of the intrinsic Si—Ge—C layer 30 is clearly noticeable in FIG. 4, as this layer has acted as a buffer or retardation layer for the lateral migration of the boron implant in the boron-doped Si—Ge—C layer 28 in the direction of the emitter 36, as indicated by the negative spike 70.

However, the absence of the intrinsic Si—Ge—C layer 26 between the vertical portion of the boron-doped Si—Ge—C layer 28 and the boron-implanted poly-Si region 16 forming the extended base region has ensured that the lateral boron concentration from the boron-doped Si—Ge—C layer 28 to the extended base region has a continuously decreasing profile 60, i.e. is devoid of a negative spike 40 as present in the prior art HBT depicted in FIG. 1. Consequently, the HBT of the present invention may be realized using CMOS process technology, and has a reduced base resistance compared to the HBT of FIG. 1.

For the sake of completeness, it is reiterated that the extrinsic base region as defined by the boron-doped Si—Ge—C layer 28 and the extended base region as defined by the boron-doped poly-Si regions 16 may be separated from each other by additional layers, such as the intrinsic Si-layer 24, as long as such layers do not prevent the establishment of the continuously decreasing profile 60 during the anneal step of the method of the present invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A heterojunction bipolar transistor comprising:
   a silicon substrate having a mono-crystalline surface carrying boron-doped polysilicon regions defining extrinsic base regions separated by a filled trench over a collector region in the substrate, said filled trench having an emitter portion separated from the substrate by a layer stack including a boron-doped silicon-germanium-carbon base layer in between a first silicon-germanium-carbon layer facing the silicon substrate and a second silicon-germanium-carbon layer facing the emitter portion, said emitter portion being laterally separated from the extrinsic base regions by respective side wall spacers,
   wherein the first silicon-germanium-carbon layer in said filled trench extends across the bottom of the filled trench only.

2. The heterojunction bipolar transistor of claim 1, wherein the emitter region comprises polysilicon.

3. The heterojunction bipolar transistor of claim 1, wherein a lateral boron doping profile from the base layer into the extrinsic base region decreases continuously.

4. An integrated circuit comprising the heterojunction bipolar transistor of claim 1.

5. An electronic device comprising the integrated circuit of claim 4.

* * * * *